(12) United States Patent
Linder

(10) Patent No.: US 6,333,625 B1
(45) Date of Patent: Dec. 25, 2001

(54) FAULT LOCALIZING AND IDENTIFYING DEVICE FOR ELECTRIC SYSTEMS

(76) Inventor: Stig Linder, Smultronvägen 7, 835 32 Krokom (SE)

( * ) Notice: Subject to any disclaimer, the term of this patent is extended or adjusted under 35 U.S.C. 154(b) by 0 days.

(21) Appl. No.: 09/266,021

(22) Filed: Mar. 11, 1999

(30) Foreign Application Priority Data

Mar. 13, 1998 (SE) ................................................ 9800810

(51) Int. Cl.[7] .............................................. G01R 19/00
(52) U.S. Cl. .................................................... 324/66
(58) Field of Search .......................... 324/66, 524, 540, 324/522, 509, 525; 318/790, 490; 361/80

(56) References Cited

U.S. PATENT DOCUMENTS 5,760,591 * 6/1998 Matsuda et al. .................... 324/524
5,796,258 * 8/1998 Yang ................................ 324/522

* cited by examiner

*Primary Examiner*—Safet Metjahic
*Assistant Examiner*—J Kerveros
(74) *Attorney, Agent, or Firm*—Browdy and Neimark

(57) ABSTRACT

The invention relates to a fault localizing and identifying device for electric systems. The device comprises a primary unit and a secondary unit. The primary unit comprises at least two connections which are connectible to conductors in the electric system. The secondary unit is connectible to corresponding conductors at a distance from the primary unit. The primary unit further comprises a coupling unit which has a high-impedance and a low-impedance state and which is connected between the connections, and a control unit having an output which is connected to the coupling unit and is adapted to control the coupling unit to shift between the two states. The secondary unit detects the resistance variations. This makes it possible to detect and localize different types of faults. It is also possible to identify or follow a certain conductor.

8 Claims, 5 Drawing Sheets

FAULT LOCALIZING AND IDENTIFYING DEVICE FOR ELECTRIC SYSTEMS

FIELD OF THE INVENTION

The present invention relates to a fault localizing and identifying device for electric systems. The device comprises a primary unit and a secondary unit, the primary unit comprising a first connection which is connectible to a first conductor or earth connection in the electric system, and a second connection which is connectible to a second conductor in the electric system. The secondary unit is connectible to corresponding conductors at a distance from the primary unit.

BACKGROUND ART

Prior-art fault localizing and identifying devices of the type mentioned above are used to localize, for instance, short circuits or earth faults or to follow a conductor through the system. It should be mentioned that the term electric system includes, inter alia, systems of transmission lines, fire alarm systems and house electric mains. The known devices are made up of two units having a transducer/detector or transceiver configuration. As a rule, one part is connected to a line at one end thereof, for instance, in a switch cabinet, whereupon the actual fault localizing or identification is carried out by means of the other unit at a distance from the first unit. The distance can be considerable and may, in some cases, amount to ten, twenty or more kilometers.

A known device is disclosed in DE-44 29 310. This device is used to localize earth faults in three-phase networks. It comprises a primary unit in the form of a pulse generator emitting pulses on the phase conductors via an earth coil and a secondary unit in the form of a detector detecting induced current changes at the beginning of the pulses. The change is an increase if the conductor portion between the coil and the detector is correct, but a decrease if the earth fault is located along said conductor portion.

Another prior-art device is disclosed in U.S. Pat. No. 4,642,556. This device is used to identify conductors in a power distribution network. It comprises a primary unit in the form of a transmitter which transmits current pulses in the conductor that is to be identified in the network and a detector which inductively detects the electromagnetic field generated by the current pulses around the conductor.

There are also known devices comprising a primary unit which is connected to one end of a line and which comprises resistors with different values, which are connected to the conductors, and a secondary unit which is connected to the other end of the line and which detects the resistance in the various conductors as well as the resistances in the primary unit.

A common feature of the known devices is that they are usable to a limited extent, either for a specific task, such as the two tasks first described, or for a small number of tasks, such as the last-mentioned type. They do not manage a combination of, for instance, detecting earth faults and short circuit faults in a pure main circuit and identifying a conductor in a system with connected resistive loads, such as a street lighting system.

SUMMARY OF THE INVENTION

A general object of the invention is to provide a device for localizing faults and identification in electric mains, which is usable for a larger number of various tasks than the known devices.

A special object of the invention is to provide a device for localizing faults and identification in electric mains, which is usable for localizing faults and identification in mains with connected resistive loads.

The objects are achieved by a fault localizing and identifying device according to the invention as defined in claim 1.

The primary unit of the device produces a varying resistance between the two conductors. This resistance variation is easily detectable by means of the secondary unit in some other place in the mains. An advantage of the device is that it is also usable in mains with connected resistive loads, such as lamps, since their resistance is small in relation to the high-impedance state, which means that the shift between the states can be perceived also when the number of loads connected between the primary and the secondary unit is great.

Provided that the first connection is connected to the earth conductor, it is also possible to easily detect an earth fault and also to localize the earth fault. The resistance variation is in fact detectable when the secondary unit is connected between the primary unit and the earth fault, but not when it is connected in such manner that the earth fault is positioned between the primary and the secondary unit. This means that in any case it is easy to define the position of the fault to be within two test points which can be close to each other.

BRIEF DESCRIPTION OF THE DRAWINGS

The invention and additional advantages thereof will now be described in more detail by way of embodiments with reference to the accompanying drawings, in which.

DESCRIPTION OF EMBODIMENTS

Figure 1:
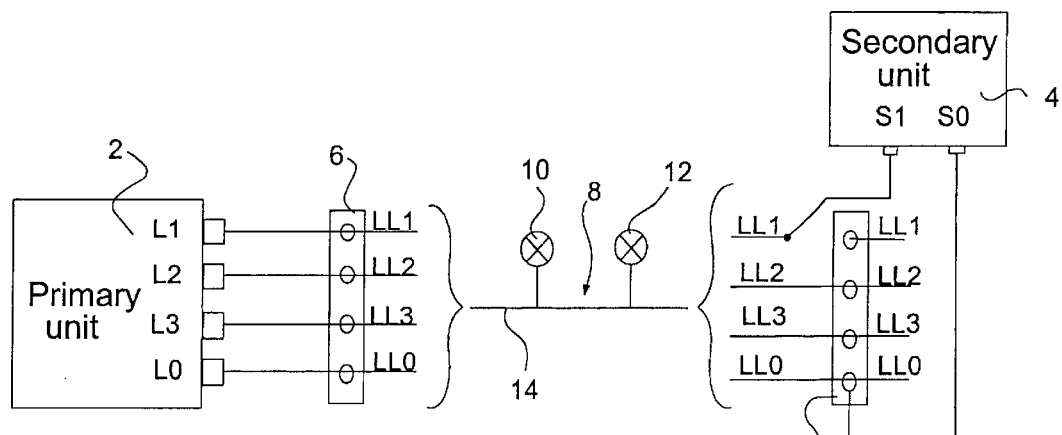
FIG. 1 illustrates how an embodiment of the inventive device can be connected in a three-phase network.

A preferred embodiment of the fault localizing and identifying device according to the invention is shown in the drawings. As is evident from FIG. 1, the device comprises a primary unit 2 and a secondary unit 4. The primary unit has first, second, third and fourth connections which are designated L1, L2, L3 and L0, respectively. These designations are selected in view of the fact that in this technical field they symbolize the three phases and the neutral conductor in a three-phase system. The connections L1–L3, L0 are connected to a first terminal 6 in a three-phase electric system 8 which is here exemplified as a street lighting system with light fittings 10, 12 and a line 14. The line 14 has four conductors LL1, LL2, LL3 and LL0 which are connected, among other things, to the first terminal 6 and to a second terminal 16, where a conductor LL1, however, is shown detached from the terminal 16. In between they are, of course, connected in a corresponding manner to each light fitting 10, 12 which is supplied by the line 14.

The secondary unit 4 has first and second connections S0 and S1. S0 is connected to the neutral conductor LL0 and S1 is connected to the phase conductor, in this case LL1, which is presently being tested. The secondary unit 4 can, generally seen, be any conventional detector whatever, whose response is dependent on the resistance between S0 and S1. It is possible to use, for instance, a buzzer which produces a buzzing sound or an optical indicator which gives light when a contact is established between the connections S0 and S1. It is also possible to use a resistance measuring device which produces a measured value. For a certain type of fault, the selection for optimum results, however, is more limited, as will appear from the following.

When performing a test in the form of fault localizing or identification in the electric system 8, the primary unit 2 is connected at a suitable connection point, from which the test starts. Then the secondary unit 4 is connected at other suitable connection points, one at a time, to localize the fault or the conductor one wants to find. Several, more detailed examples of the test procedure will be described below.

Figure 2:
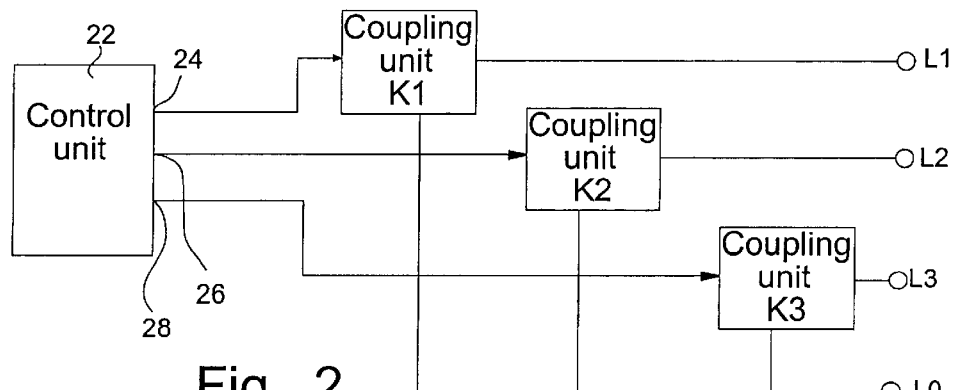
FIG. 2 is a block diagram of a primary unit included in the embodiment.
Figure 3:
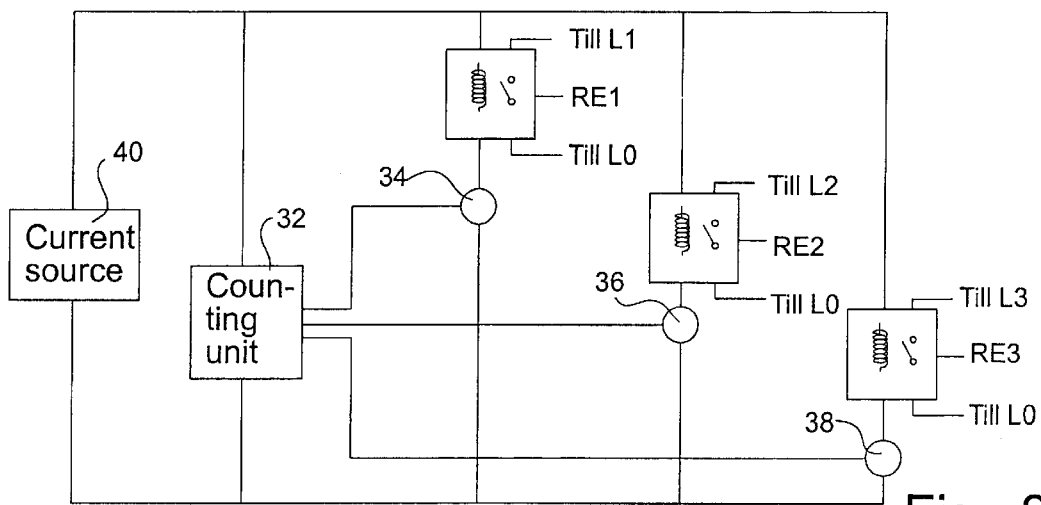
FIG. 3 is a more detailed block diagram of the primary unit in FIG. 2.

First follows a more detailed description of the primary unit with reference to FIGS. 2 and 3. At a comprehensive block diagram level, as shown in FIG. 2, the preferred embodiment of the device comprises first, second and third coupling units K1, K2 and K3, which are each connected between a respective one of the first to third connections L1–L3 and the fourth connection L0. The fourth connection L0 thus constitutes a common connection for the coupling units K1–K3. The device further comprises a control unit 22 having first, second and third outputs 24, 26 and 28 which are each connected to a respective one of the coupling units K1–K3.

Each of the coupling units K1–K3 has a low-impedance, or closed, state, and a high-impedance, or broken, state. The shift between the states is controlled by the control unit 22 by its sending change-over signals to the coupling units K1–K3. The signals have different frequencies so that the states of the different coupling units K1–K3 are shifted at different rates.

When the primary unit 2 is, according to FIG. 1, connected to one end of a line and the secondary unit 4 is connected, at another connection point, to the same line according to FIG. 1, the secondary unit 4 will experience a closed circuit when the first coupling unit K1 is in a closed state and an open circuit when the first coupling unit K1 is in a broken state and respond correspondingly. Now assume that the secondary unit 4 is a lamp indicator and that no conductor is short-circuited or broken. The lamp will then flash on and off at the frequency of the change-over signal to the first coupling unit K1. If the second connection S1 of the indicator 4 is connected to the second conductor LL2 instead, the lamp will flash on and off at a different frequency. In this manner, it is possible to find many types of fault and carry out many different kinds of identifications, as will be exemplified below. In contrast to many known devices, the device will be insensitive to resistive loads which are connected between the primary and the secondary unit 2, 4 since their resistance normally is low enough for the shift between broken and closed state to be registered by the secondary unit 4.

At a more detailed block diagram level as shown in FIG. 3, the preferred embodiment of the device is composed as follows. Each coupling unit K1–K3 consists of a relay RE1–RE3, whose relay coil is supplied with the change-over signal and whose relay switch is connected between the fourth connection L0 and one of the other connections L1–L3. The control unit comprises a counting unit 32, first to third transistors 34, 36, 38 and a source of current 40. The transistors 34, 36, 38 constitute the outputs 24, 26, 28 of the control unit 22 and are directed between a conductive and a throttled state by the counting unit 32. The primary unit is supplied by its own source of current 40 which preferably is a chargeable accumulator. The counting unit 32 can be built around one counter which can generate three different output signals or a plurality of counters which generate one or two output signals. Suitable frequencies of the change-over signals are 2.5 Hs, 5.0 Hz and 10.0 Hz, respectively.

Now follow some examples of tests that can be carried out by using the device. It should be mentioned that the system 8 must be dead during testing.

Figure 4A:
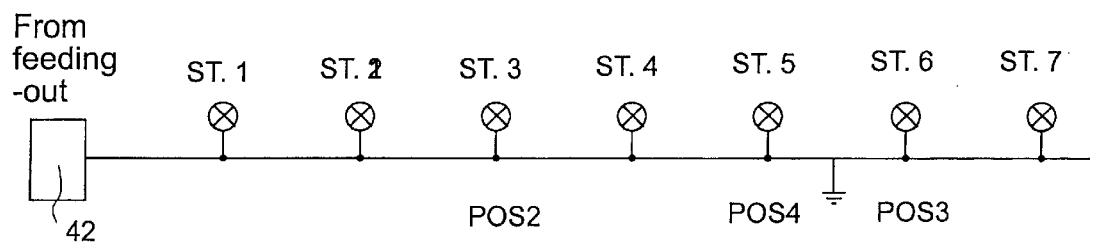
FIGS. 4A–4E illustrate an example of application.
Figure 4B:
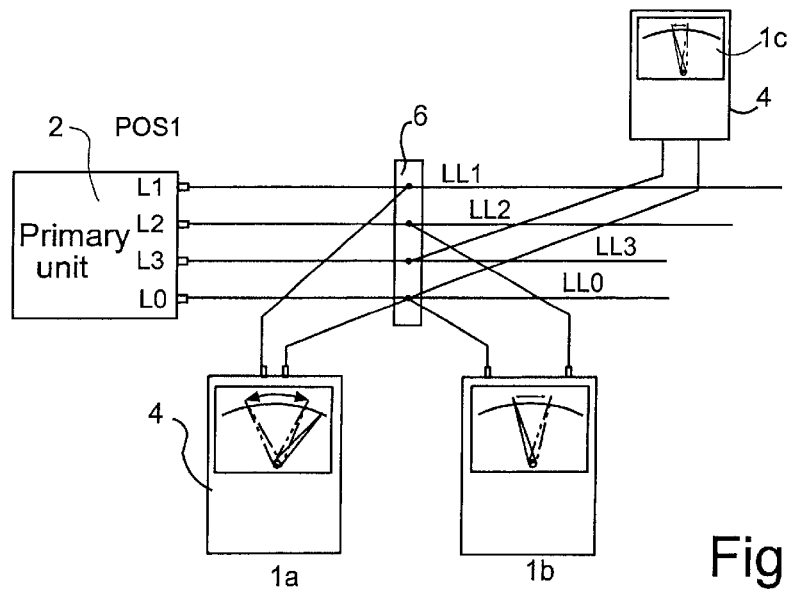
Figure 4C:
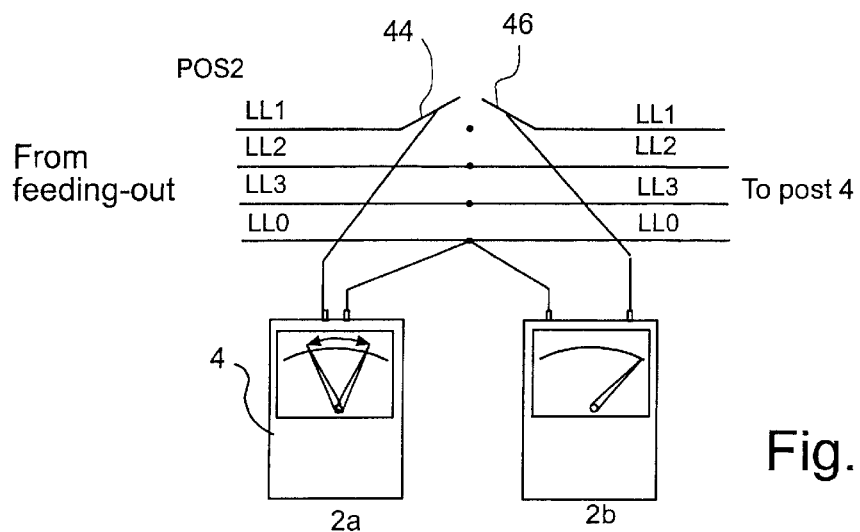
Figure 4D:
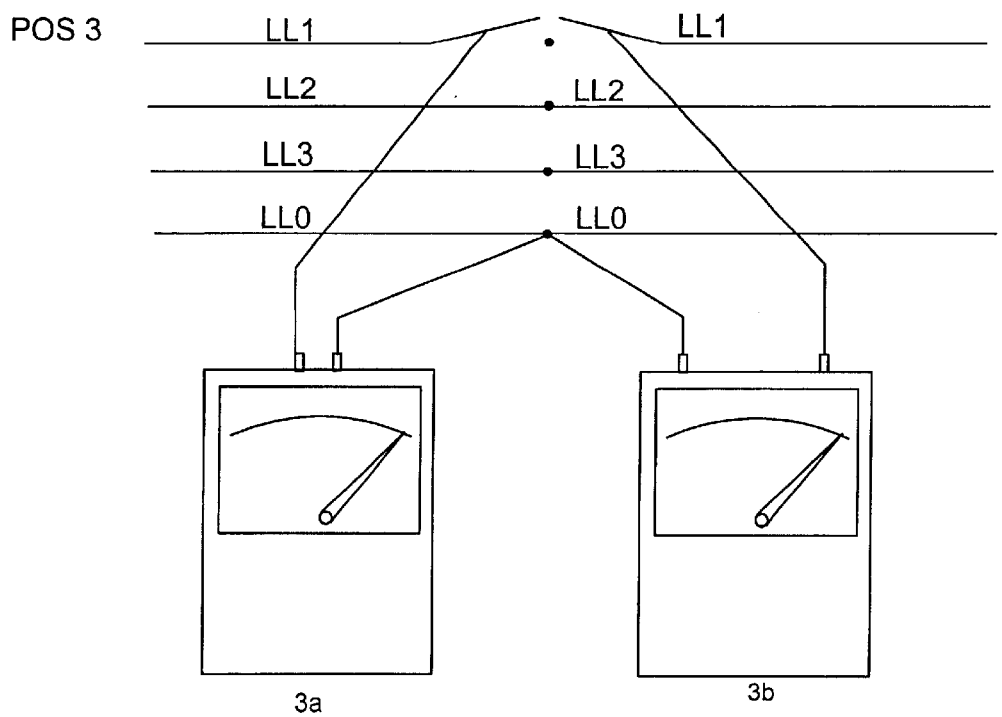
Figure 4E:
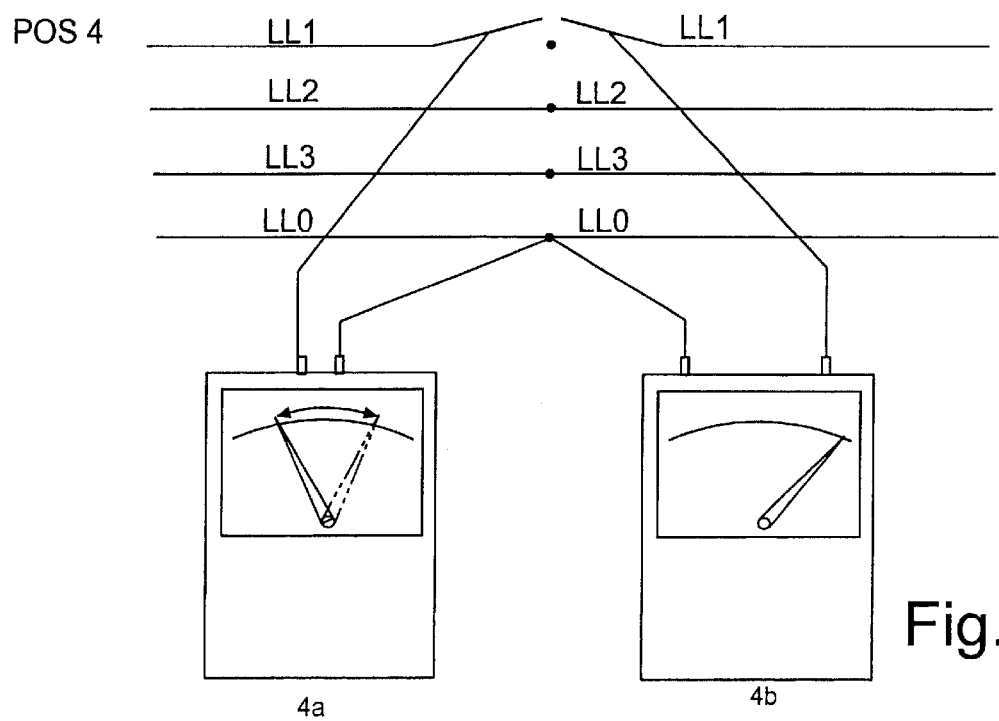

A usual problem is earth fault, i.e. that one of the phases is short-circuited to earth owing to, for instance, insufficient insulation. FIGS. 4A–4E show the localizing of an earth fault in a street lighting system with incandescent lamps. FIG. 4A shows, at the top, basically the actual mains with a feeding-out cabinet 42 furthest to the left, from which the three-phase line extends to the right, lamp posts being symbolized by light bulbs and designated ST1–ST7, connected at regular intervals. Moreover, four positions POS1–POS4 are indicated, the primary unit 2 (POS1) and the secondary unit 4 (POS2–4) being connected at different stages of the localizing of a fault. The actual earth fault is symbolized by an earth symbol between the fifth and the sixth post ST5, ST6. In a first position POS1, i.e. in the feeding-out cabinet, the primary unit 2 is connected, the fourth output L0 to the earth bar LL0 and the first to the third output L1–L3 to a corresponding conductor LL1–LL3. The earth fault, which is single-phase, is indicated by a released fuse in the feeding-out cabinet 42 when being opened. In order to establish whether the fault remains, one output, for instance S0, of the secondary unit 4 is connected to the earth bar LL0 and its other output, for instance S1, in turns to the phase conductors LL1–LL3. In this case, a lamp indicator or buzzer functions in a less satisfactory manner as the secondary unit 4 since the incandescent lighting provides a closed loop although with a certain resistance, and thus an essentially fixed indication for all phases although the shift of states results in a certain breakdown in the form of weak variations. On the other hand, a conventional ohmmeter, such as a multimeter which is set to meter ohm, gives a clear indication. Such an ohmmeter is illustrated schematically in FIGS. 4B–4E. When connected according to 1a, the ohmmeter 4 detects a fixed value close to zero ohm since the earth fault results in short-circuiting between the first phase LL1 and the earth connector LL0. In the absence of a fault, the pointer would have swung between the two positions indicated by dashed lines. When connecting to the second phase LL2, according to 1b, the pointer swings between two positions, with a certain angle between them, and when connecting to the third phase LL3, according to 1c, the pointer swings between two positions, with a smaller angle between them. The swinging movements are effected by the alternating closing and breaking of the relays RE1–RE3, which is this case results in a pulsating short-circuiting of the phases to earth, which is also referred to as short to earth. Since the change-over signals have different frequency and the ohmmeter has a certain amount of inertia, different angles are obtained between the positions between which the pointer swings.

It may thus be established that an earth fault exists somewhere along the first phase conductor LL1. With a view to establishing where the fault is positioned, the secondary unit 4 is connected somewhere else along the line, for instance, in the second position POS2, i.e. in the third post ST3. The ends of the conductor LL1 which is divided at the terminal are released and the secondary unit is connected first to one end 44 and earth LL0 and then to the other end 46 and earth LL0. In the first case, according to 2a, a swinging movement is obtained, but not in the second case. This proves that the pulsating short to earth affects the ohmmeter 4, i.e. that the earth fault is positioned further away from the feeding-out cabinet 42. When correspondingly connecting to the sixth post ST6 in POS3, according to 3*a* and 3*b*, respectively, no swinging movement at all is obtained. This means that the fault has been passed. Connecting to the post ST5 in POS4 finally indicates that the fault is positioned between the posts ST5 and ST6.

In a system of lighting with mercury discharge light fittings, a buzzer, lamp indicator or the like gives, in contrast to the example above, as clear an indication as does an ohmmeter since the secondary unit 4 then perceives the fitting to have high impedance. By using, for example, a buzzer, the result of the corresponding procedure will be as follows. In the position POS2, short tones arise in 2*a* and a long tone in 2*b*. In the position POS3, a long tone arises in 3*a* and no tone at all in 3*b*. Finally, in the position POS4, the same response is obtained as in the position POS2.

Figure 5:
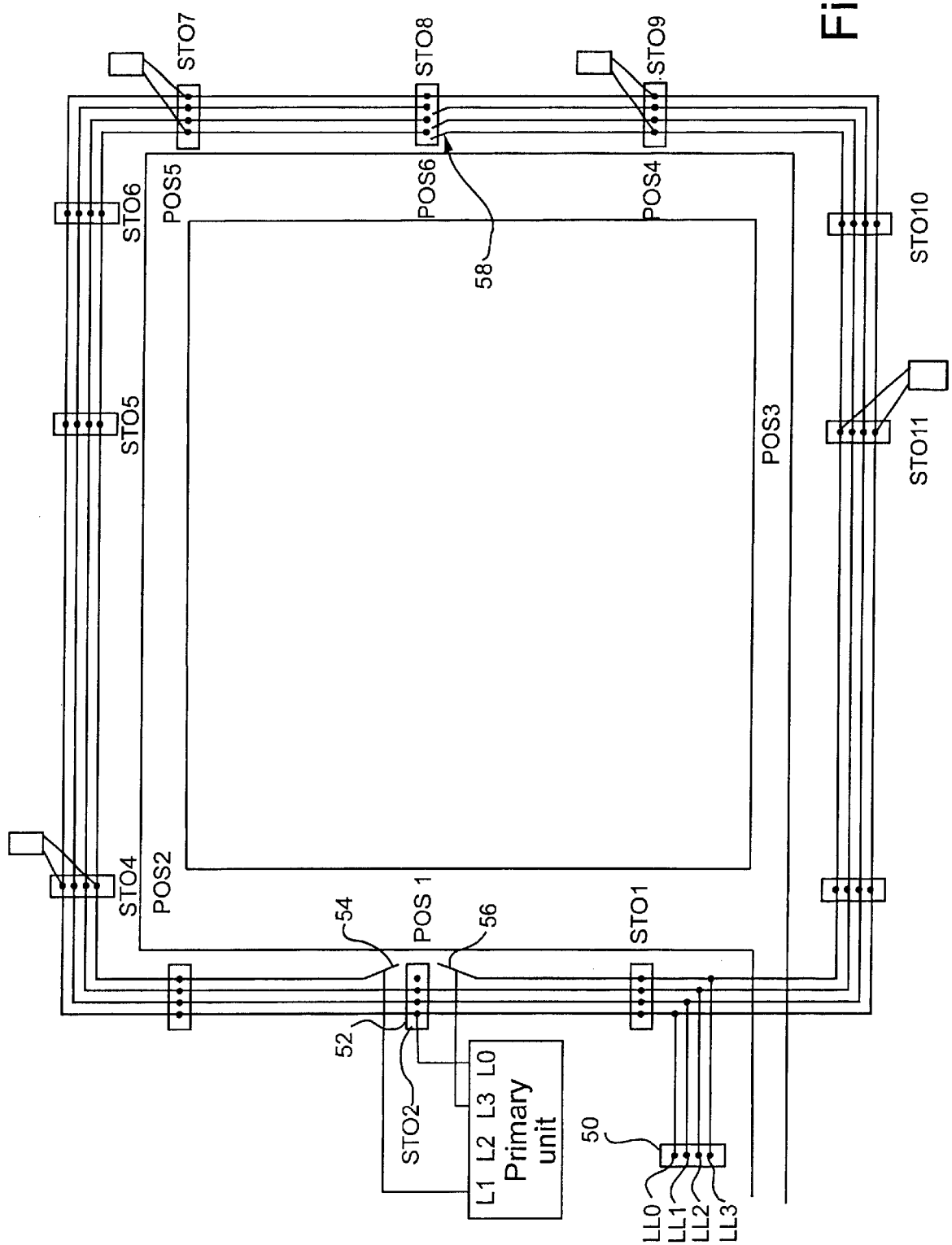
FIGS. 5–6 illustrate two further examples of application.

A further example of the use of the device is to trace a sectioning point in a ring main system, which is illustrated in FIG. 5. A feeding-out cabinet is designated 50. In one of the posts STO1–STO12, the ends 54, 56 of one of the phase conductors LL1–LL3 is detached from the terminal 52. The connection L0 of the primary unit 2 is connected to the neutral conductor LL0 at the terminal 52. Two of the other connections, e.g. L1, L3, of the primary unit 2 are each connected to a respective one of the detached ends 54, 56. Since the connections L1, L3 are connected to the connection L0 at different frequencies, it is possible to localize the sectioning point 58 which is here shown adjacent to the eighth post STO8.

By connecting the secondary unit 4 in turns in the positions POS1–POS6, it is possible to trace the sectioning point in an efficient manner. On one side of the sectioning point 58, more precisely in the positions POS3 and POS4, the secondary unit 4 will give a pulsating indication at the frequency at which the third coupling unit K3 connected to the connection L3 is operated. On the other side of the sectioning point, more precisely in the positions POS2 and POS5, the secondary unit 4 will give a pulsating indication at the slower frequency at which the coupling unit K1 connected to the connection L1 is operated. It should be pointed out that in this example it is not necessary to disconnect the conductor LL1 anywhere besides the position where the primary unit 2 is connected.

Figure 6:
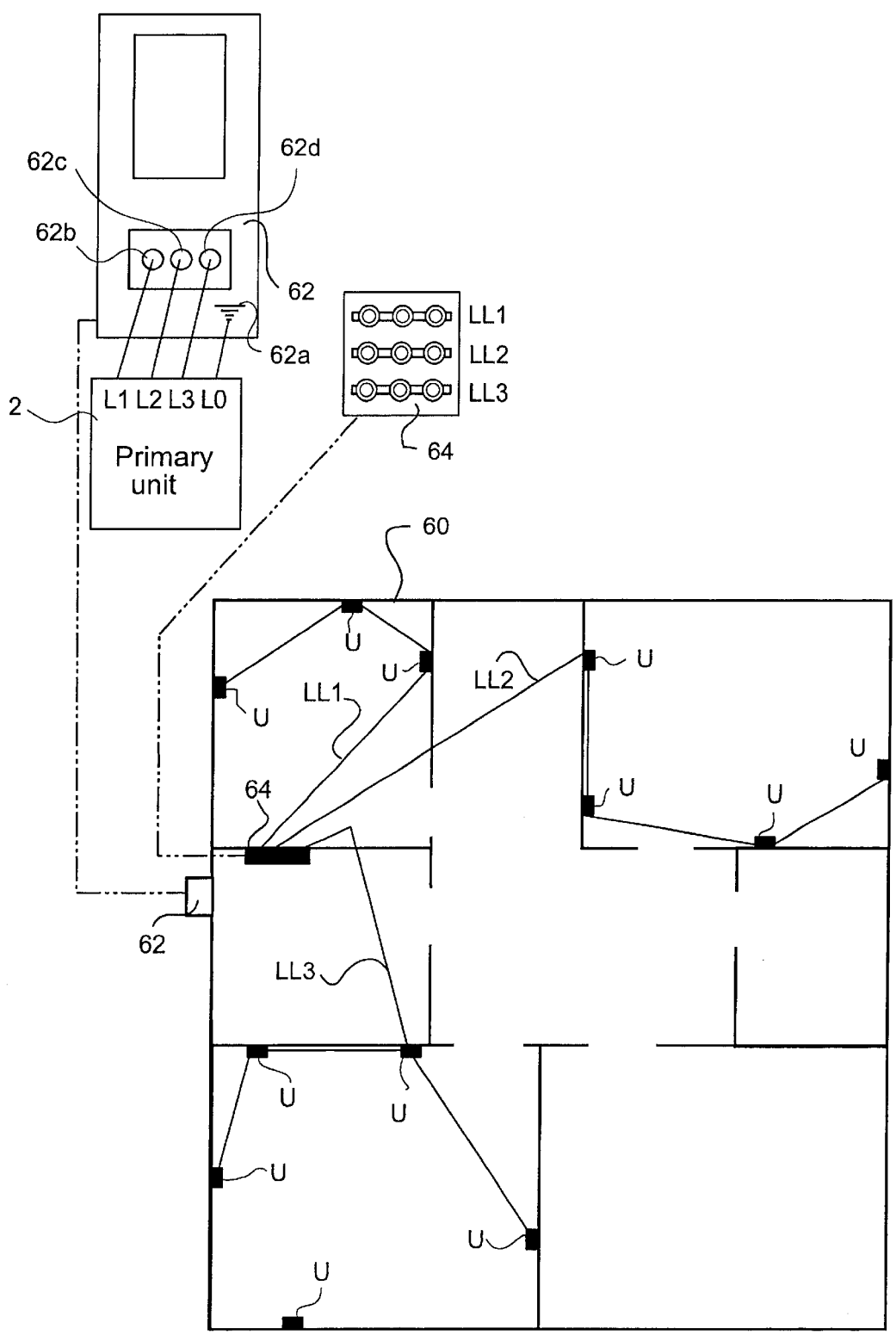

One more example of how the device can be used is shown in FIG. 6. In this case, one wants to identify which phase is connected to the respective object in a house. The house is designated 60. The primary unit 2 is connected in a metering cabinet 62 where the incoming phase conductors are protected with main fuses. The common connection L0 of the primary unit 2 is connected to an earth connection 62*a* and the other connections L1–L3 are each connected to a fuse output 62*b*–62*d* which protects the phases LL1–LL3. Thus, the primary unit 2 is connected to the group fuse box 64 of the house 60 and more specifically to the phase bars feeding the consumers in the house via different fuse groups C1–C3, C4–C6, C7–C9.

By connecting the secondary unit 4 to an output U in the house 60, it is then easy to establish which outputs load the different fuse groups. It is thus easy to establish and take care of any imbalance that may exist between the phases. By mounting only one fuse at a time in each group, it is even possible to establish which outputs load a certain fuse.

Other fields of application that the examples given above, are, enter alia, short circuit between phases;

phase drop-out;

identification of phases in a cut-off cable;

identification of the correct cable in a post having a plurality of cables; and lengthening of a cable.

A preferred embodiment of the fault localizing and identifying device according to the invention has been described above. This should only be seen as non-limiting example. Many modifications which are within the possibilities of those skilled in the art, are feasible within the scope of the invention as defined in the appended claims. Below follow some examples of such modifications.

ALTERNATIVE EMBODIMENTS

One example of a modification is changing the number of connections of the primary unit as required. In its simplest form, the primary unit has two outputs only. Admittedly, such a primary unit is not practical if a single person should, for example, identify the phases in a three-phase network, but is quite acceptable for single-phase applications and identification of a single conductor among a number of conductors. On the other hand, there may be a need for considerably more connections than three.

A further example of modification is using grouped quick shifts which are separated by long intervals in one of the states, instead of separating the outputs of the primary unit from each other by different shifting frequencies for the shifts of states. Each output has a different number of shifts in the group, for instance, one, two or three shifts. However, the most obvious differences will be obtained when using the different frequencies of the preferred embodiment.

As regards the choice of circuit elements, the choice is not absolute either, and, for instance, it is possible to use coupling elements other than relays and control elements other than transistors, but these constitute a well-functioning and robust combination which yields distinct shifts of states.

What I claim and desire to secure by Letters Patent is:

1. A device for localizing and identifying faults in an electric system when no power is being supplied by the electric system, comprising a primary unit and a secondary unit, the primary unit comprising a first connection which is connectible to a first conductor or earth conductor in the electric system, and a second connection which is connectible to a second conductor in the electric system, and the secondary unit being connectible to the corresponding conductors at a distance from the primary unit, the primary unit further comprising: a coupling unit which has a high impedance state and a low impedance state and which is connected between the connections, and a control unit having a first output which is connected to the coupling unit and adapted to control the coupling unit to shift between said two states, and that the secondary unit is a detector which detects resistance variations between the corresponding conductors due to shifts occurring between said two states under control by the control unit.

2. A fault localizing and identifying device according to claim 1, comprising: third and fourth connections which are each connectible to a further conductor in the line, further comprising a second and a third coupling unit, which are of the same type as the first coupling unit and which are connected between the third and the first and respectively between the fourth and the first connection, wherein the control unit with second and third outputs is connected to the second and the third coupling unit, respectively, the control unit being adapted to control the coupling units for changing of states at different frequencies.

3. A fault localizing and identifying device according to claim 2, wherein the coupling units are relays, and the control unit comprises a counter which with different frequency division controls the different relays via transistors.

4. A fault localizing and identifying device according to claim 1, wherein the secondary unit is a resistive indicator.

5. A fault localizing and identifying device according to claim 1, wherein at least the second conductor is a phase conductor and the coupling unit provides an impedance that is connected between the connections and that is switchable between a high impedance value and a low impedance value.

6. A fault localizing and identifying device according to claim 1, wherein: said primary unit further comprises a third connection which is connectible to a further conductor in the electrical system, and a second coupling unit which has a high impedance state and a low impedance state and which is connected between the third connection and one of the first and second connections; said control unit has a second output which is connected to the coupling unit and adapted to control the second coupling unit to shift between said two states; and said control unit is adapted to control the coupling units for shifting the states of the first-recited coupling unit at a first frequency and for shifting the states of the second coupling unit at a second frequency different from the first frequency.

7. A fault localizing and identifying device according to claim 1, wherein at least said secondary unit is a portable unit.

8. A fault localizing and identifying device according to claim 1, wherein said control unit is operative to control the coupling unit to shift between said two states a plurality of times in a cyclic manner.

* * * * *